United States Patent
Sadaka et al.

(10) Patent No.: US 7,285,452 B2
(45) Date of Patent: Oct. 23, 2007

(54) METHOD TO SELECTIVELY FORM REGIONS HAVING DIFFERING PROPERTIES AND STRUCTURE

(76) Inventors: Mariam G. Sadaka, 3119 Napa Dr., Austin, TX (US) 78738; Bich-Yen Nguyen, 110 Laurelwood Dr., Austin, TX (US) 78733; Voon-Yew Thean, 10201 Lockleven Cove, Austin, TX (US) 78750; Ted R. White, 6508 Laurelwood Dr., Austin, TX (US) 78731

( * ) Notice: Subject to any disclaimer, the term of this patent is extended or adjusted under 35 U.S.C. 154(b) by 83 days.

(21) Appl. No.: 11/351,518

(22) Filed: Feb. 10, 2006

(65) Prior Publication Data

US 2007/0190745 A1    Aug. 16, 2007

(51) Int. Cl.
*H01L 21/336* (2006.01)
(52) U.S. Cl. .............. 438/198; 438/198; 438/973; 438/766; 438/199
(58) Field of Classification Search ................ 438/198, 438/766, 973, 221, 976
See application file for complete search history.

(56) References Cited

U.S. PATENT DOCUMENTS

| 6,048,411 A * | 4/2000 | Henley et al. ............. 148/33.5 |
|---|---|---|
| 6,635,543 B2 | 10/2003 | Furukawa et al. |
| 2005/0116290 A1 * | 6/2005 | de Souza et al. ............ 257/347 |
| 2005/0224797 A1 * | 10/2005 | Ko et al. ....................... 257/64 |
| 2007/0108481 A1 * | 5/2007 | Thean et al. .................. 257/288 |

FOREIGN PATENT DOCUMENTS

WO    WO 2005/057631 A2    6/2005

* cited by examiner

*Primary Examiner*—B. William Baumeister
*Assistant Examiner*—Jenny L Wagner
(74) *Attorney, Agent, or Firm*—James L. Clingan, Jr.; Robert L. King

(57) ABSTRACT

A semiconductor device is formed having two physically separate regions with differing properties such as different surface orientation, crystal rotation, strain or composition. In one form a first layer having a first property is formed on an insulating layer. The first layer is isolated into first and second physically separate areas. After this physical separation, only the first area is amorphized. A donor wafer is placed in contact with the first and second areas. The semiconductor device is annealed to modify the first of the first and second separate areas to have a different property from the second of the first and second separate areas. The donor wafer is removed and at least one semiconductor structure is formed in each of the first and second physically separate areas. In another form, the separate regions are a bulk substrate and an electrically isolated region within the bulk substrate.

13 Claims, 6 Drawing Sheets

METHOD TO SELECTIVELY FORM REGIONS HAVING DIFFERING PROPERTIES AND STRUCTURE

FIELD OF THE INVENTION

The invention relates to a method of making a semiconductor device and, more particularly, to a method for selectively forming regions that have different properties.

BACKGROUND OF THE INVENTION

A recognition that transistors of different types have different operating characteristics based on the nature of the crystalline structure has resulted in the development of semiconductor structures that are selected based on the transistor type. For example, N channel transistors have higher carrier mobility when formed in silicon with a (100) surface orientation than in a (110) surface orientation. The opposite is true for P channel transistors. Thus, techniques have been developed for forming the N channel transistors in a (100) surface orientation and P channel transistors in a (110) surface orientation. Similarly, techniques have been developed for forming N channel transistors in silicon that is under tensile stress and P channel transistors that are under compressive stress along the direction of the current flow in a <110> crystal direction. One of the difficulties in achieving these results has been achieving the particular enhancing property for both transistor types on the same integrated circuit. The complexity is further increased when semiconductor-on-insulator (SOI) is the desired technique for both transistor types.

Thus, there is a need for a method for overcoming or at least reducing the difficulties in achieving different semiconductor properties for the transistor types for enhancing performance.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a semiconductor device has a first semiconductor region of a first property such as a (110) surface orientation and a second semiconductor region separated from the first region by isolation. The first property is chosen to enhance the operation of a first transistor type. The second region is converted to amorphous while leaving the first region with the first property. A semiconductor layer having a second property that enhances the operation of a second transistor type is then bonded to the semiconductor device. The second region is then converted to the second property based on being bonded to the semiconductor having the second property. The semiconductor layer is removed. A transistor of the first type is formed in the first region, and a transistor of the second type is formed in the second region. This is better understood by reference to the drawings and the following description.

Figure 1:
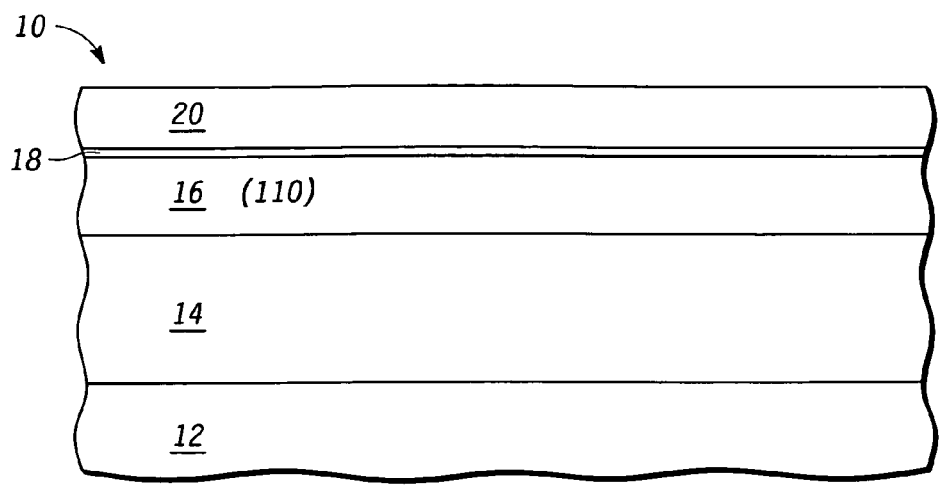
FIG. 1 is a cross section of a semiconductor device structure at a stage in processing according to an embodiment of the invention.

Shown in FIG. 1 is a semiconductor device structure 10 comprising a semiconductor-on-insulator (SOI) substrate comprised of a silicon layer 12, a buried oxide layer 14 on silicon layer 12, and a semiconductor layer 16 formed on the buried oxide layer; a pad oxide layer 18 on semiconductor layer 16; and a silicon nitride layer 20 on pad oxide layer 18. The materials for the layers may be different than specifically described for this example. For example, the buried oxide could be a different insulating material such as silicon nitride. In this example semiconductor layer 12 is silicon with a surface orientation of (110). Other properties that could alternatively be chosen for semiconductor layer are composition, strain, surface orientation, and crystal rotation. Silicon germanium is the most likely alternative for composition. Strain can be compressive, tensile, or relaxed. Surface orientation could also be (100) for silicon or silicon germanium. Crystal rotations are generally either <100> or <110>. Pad oxide layer 18 is about 100 Angstroms thick. Silicon nitride layer 20 is about 700 Angstroms thick which is also about the same thickness as semiconductor layer 16. Buried oxide layer 14 is much thicker than semiconductor layer 14, and silicon layer 12 is much thicker than buried oxide layer 14.

Figure 2:
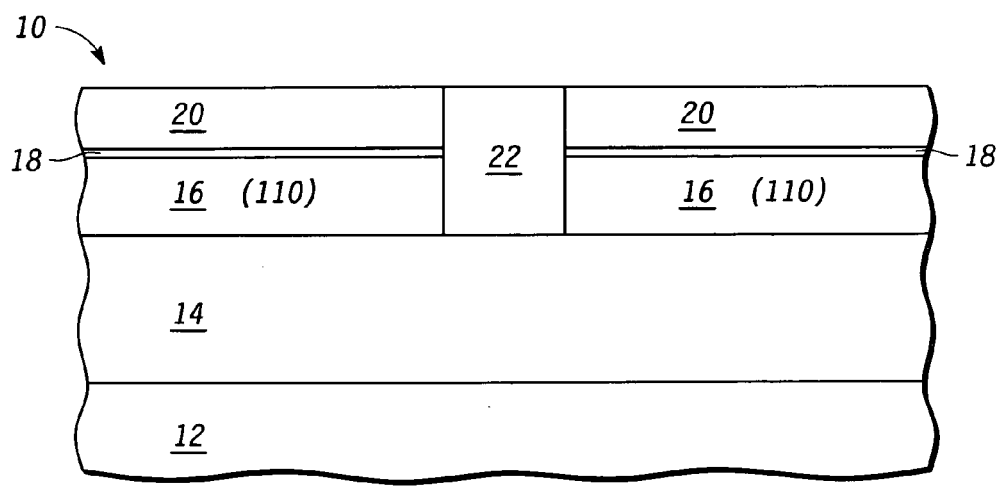
FIG. 2 is a cross section of the semiconductor device structure of FIG. 1 at a subsequent stage in processing to that shown in FIG. 1.

Shown in FIG. 2 is semiconductor device structure 10 after formation of an isolation region 22 through nitride layer 20, pad oxide layer 18, and semiconductor layer 16. This is formed by performing a patterned etch followed by an oxide deposition which in turn is followed by a step of chemical mechanical polishing (CMP). This isolation region is sometimes called shallow trench isolation (STI). This separates two regions of semiconductor layer 16.

Figure 3:
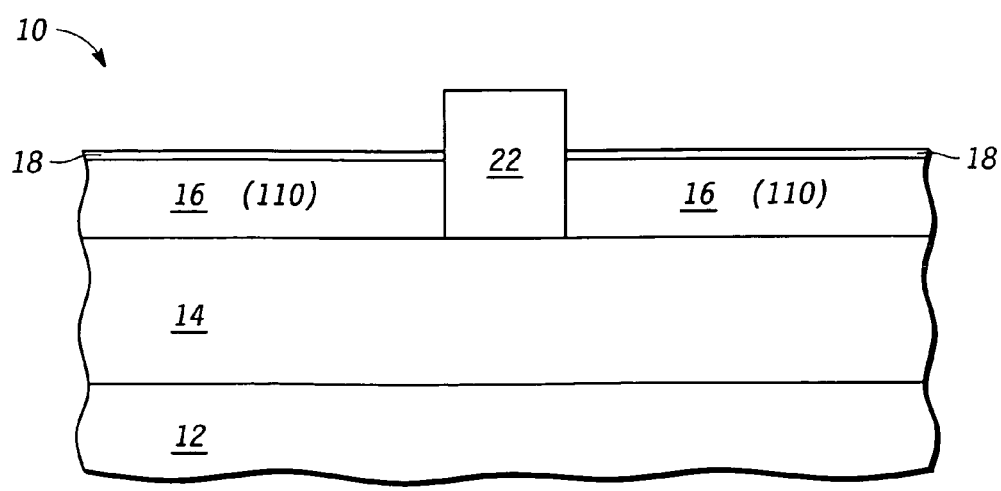
FIG. 3 is a cross section of the semiconductor device structure of FIG. 2 at a subsequent stage in processing to that shown in FIG. 2.

Shown in FIG. 3 is semiconductor device structure 10 after removing nitride layer 20 leaving isolation region 22 protruding above pad oxide 18. This is performed using an etch that is selective between oxide and nitride. Hot phosphoric acid is effective for this purpose.

Figure 4:
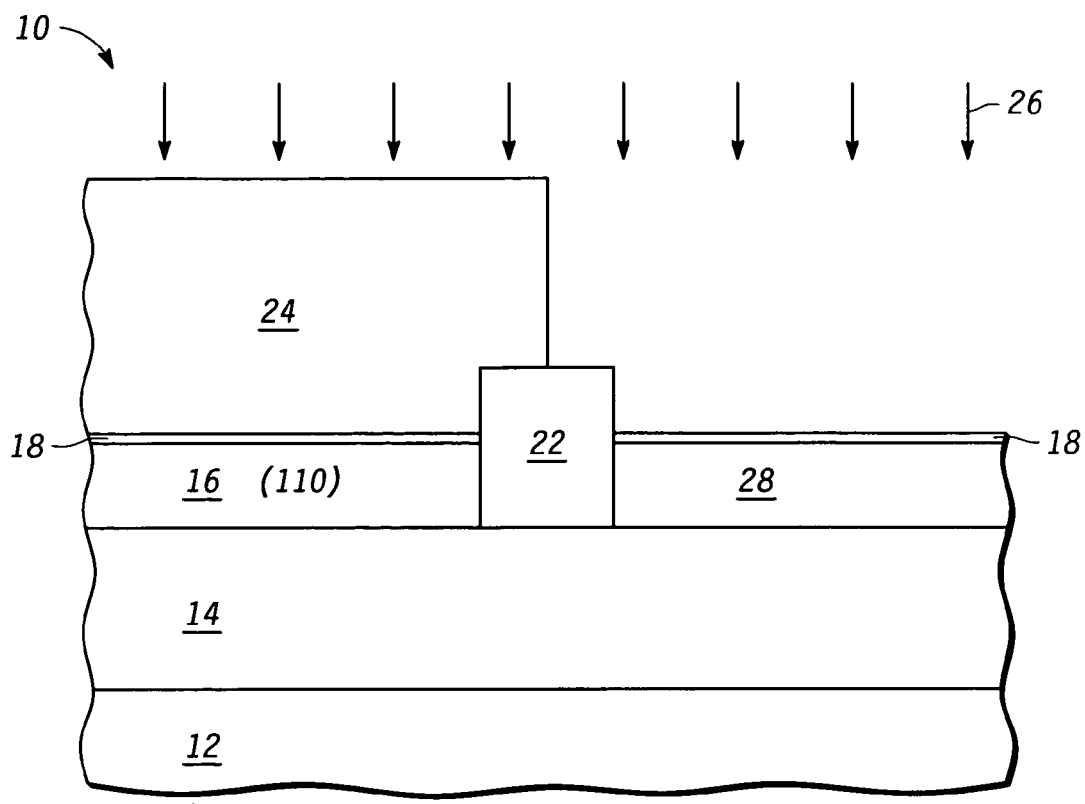
FIG. 4 is a cross section of the semiconductor device structure of FIG. 3 at a subsequent stage in processing to that shown in FIG. 3.

Shown in FIG. 4 is semiconductor device structure 10 after depositing and patterning a photoresist layer to leave a photoresist layer 24 that exposes one portion of semiconductor layer 16 adjacent to isolation region 22 and then performing an implant 26 that converts the exposed portion of semiconductor layer 16 to being an amorphous region 28. Thus, amorphous region 28 is converted from monocrystalline silicon with a (100) surface orientation to a region that is simply amorphous. Implant 26 is preferably performed by a material that is heavy enough for the conversion to be complete. Two effective choices are xenon and silicon. Other alternatives may also be effective. Another objective may include converting to another composition such as converting silicon to silicon germanium so that germanium would be the preferred choice as the implant species. For an example of a conversion process, one implant at an energy of 20 KeV and another implant at an energy of 40 KeV with both implants at a dose of about 1E15 (one times 10 to the $15^{th}$) are applied. Subsequently a ten second anneal at a temperature of about 1070 Celsius is applied in an inert ambient. A wide range of these parameters would also be effective for this purpose. For example, a temperature range of 600-1300 degrees Celsius may be used. In general the effect of speeding up the conversion is by increasing the weight of the species, increasing the dose, and increasing the anneal temperature. The energies relate to the depth of semiconductor layer 16. If semiconductor layer 16 is increased in thickness, then there would be an increase in likelihood of needing an additional energy for implanting to add to the other two. Similarly, a thinning of semiconductor layer 16, increases the likelihood that only one implant energy would be required. Other inert implant species to consider are argon, helium, and krypton although helium is unattractive because it is very light. There may situations in which a whole region may be desirable to be doped so that a dopant may be useful as an implant species. In such case, phosphorus, boron, and arsenic would be useful.

Figure 5:
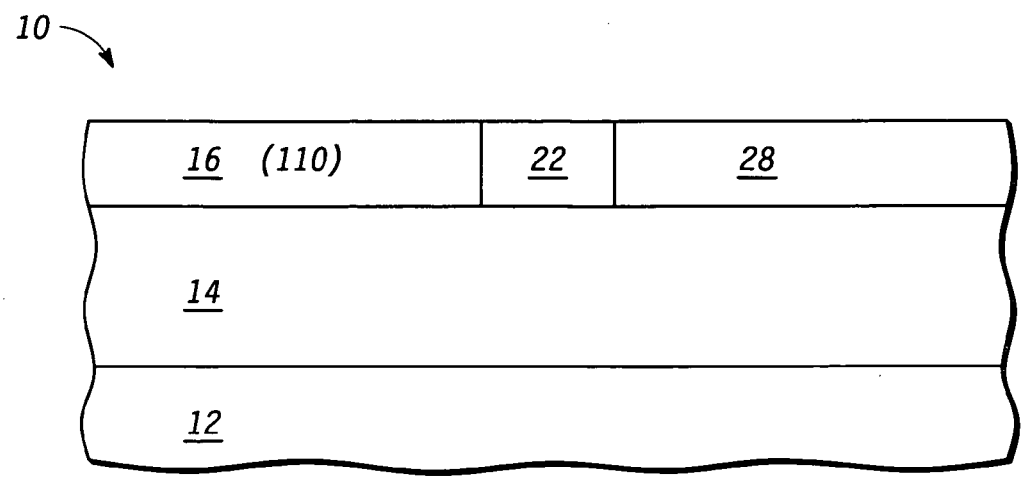
FIG. 5 is a cross section of the semiconductor device structure of FIG. 4 at a subsequent stage in processing to that shown in FIG. 4.

Shown in FIG. 5 is semiconductor device structure 10 after performing a CMP step to provide planar surface for semiconductor region 16, amorphous region 28, and isolation region 22. It is desirable for the top surfaces of amorphous region 28 and semiconductor region 16 be coplanar and that no portion of isolation region 22 be above either amorphous region 28 or semiconductor region 16.

Figure 6:
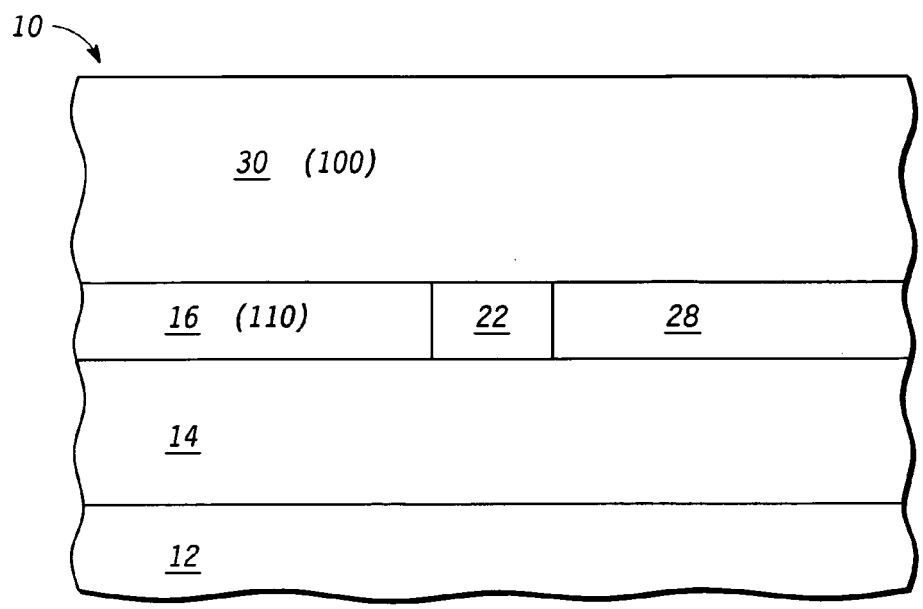
FIG. 6 is a cross section of the semiconductor device structure of FIG. 5 at a subsequent stage in processing to that shown in FIG. 5.

Shown in FIG. 6 is semiconductor device structure 10 after applying a semiconductor substrate 30 to the top surface of amorphous region 28 and the top surface of semiconductor region 16. As direct a contact as possible between substrate 30 and the whole top surface of amorphous region 28 is desirable. This relates to the degree of coplanarity of the top surfaces of semiconductor region 16 and amorphous region 28 and isolation region 22 not extending above the top surfaces of semiconductor region 16 and amorphous region 28. The desired close contact is maintained by bonding. Bonding techniques for holding semiconductor surfaces in close contact are known. In this example, semiconductor substrate 30 has the (100) surface orientation.

Figure 7:
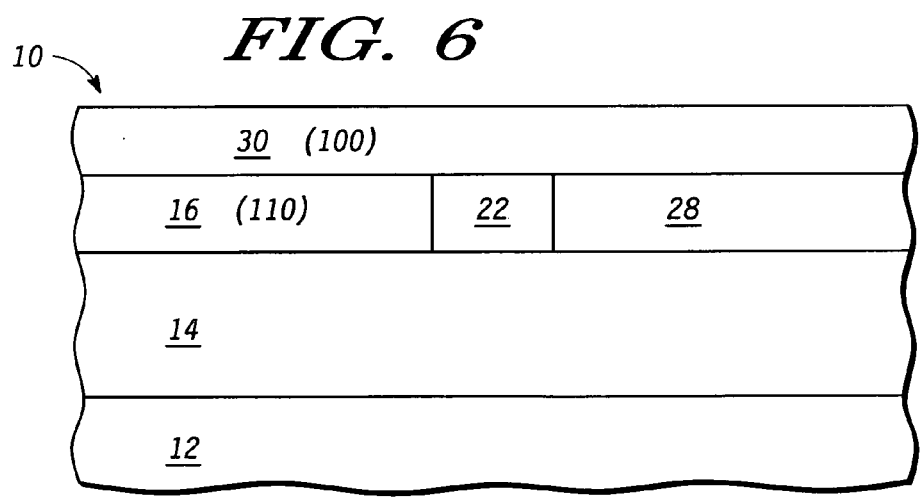
FIG. 7 is a cross section of the semiconductor device structure of FIG. 6 at a subsequent stage in processing to that shown in FIG. 6.

Shown in FIG. 7 is semiconductor device structure 10 after a major portion of semiconductor substrate 30 has been cleaved away. A convenient way to remove this major portion is to perform a hydrogen implant in semiconductor substrate 30 to the desired depth of the cleave followed by an anneal before applying and bonding semiconductor substrate 30. Thus, after applying and bonding, it may conveniently be cleaved.

Figure 8:
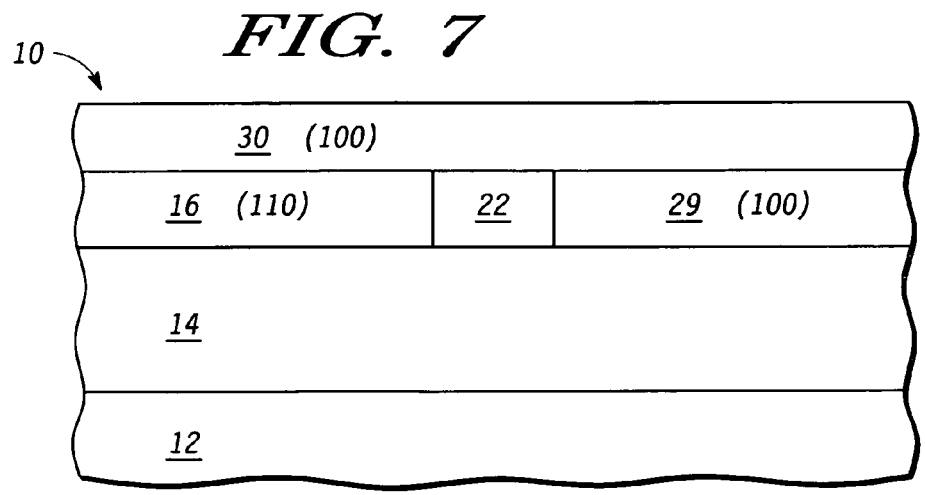
FIG. 8 is a cross section of the semiconductor device structure of FIG. 7 at a subsequent stage in processing to that shown in FIG. 7.

Shown in FIG. 8 is semiconductor device structure 10 after performing an anneal to cause amorphous region to become monocrystalline with the crystalline properties of semiconductor substrate 30. In this example amorphous region 28 becomes a semiconductor region 29 that is monocrystalline with a (100) surface orientation. This transfer of crystal properties to an amorphous region by physical contact is sometimes called solid phase epitaxy (SPE). This transference of the crystal property of semiconductor substrate 30 causes semiconductor substrate 30 to act as a donor wafer.

Figure 9:
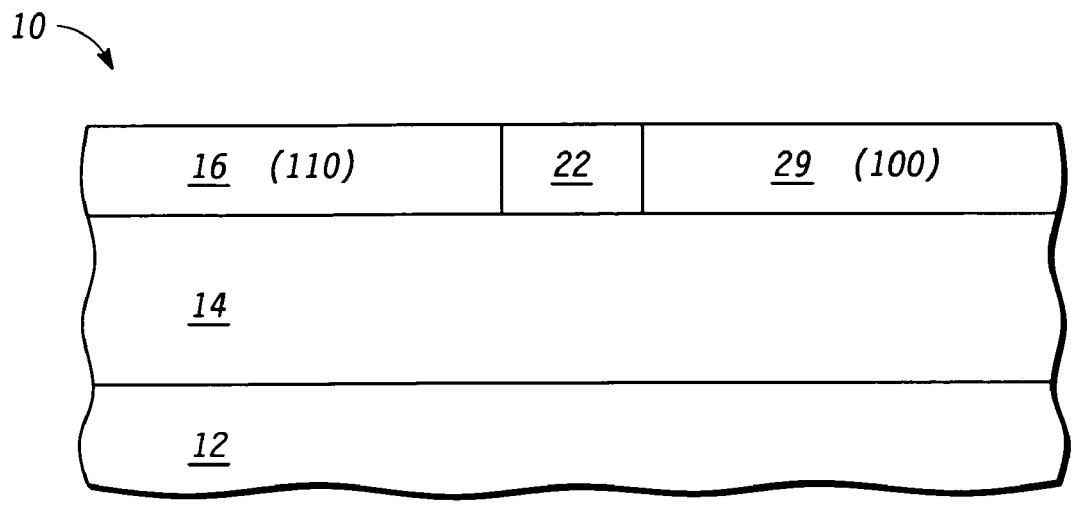
FIG. 9 is a cross section of the semiconductor device structure of FIG. 8 at a subsequent stage in processing to that shown in FIG. 8.

Shown in FIG. 9 is semiconductor device structure 10 after removing semiconductor substrate 30. This provides semiconductor regions 16 and 29 for use in making transistors.

Figure 10:
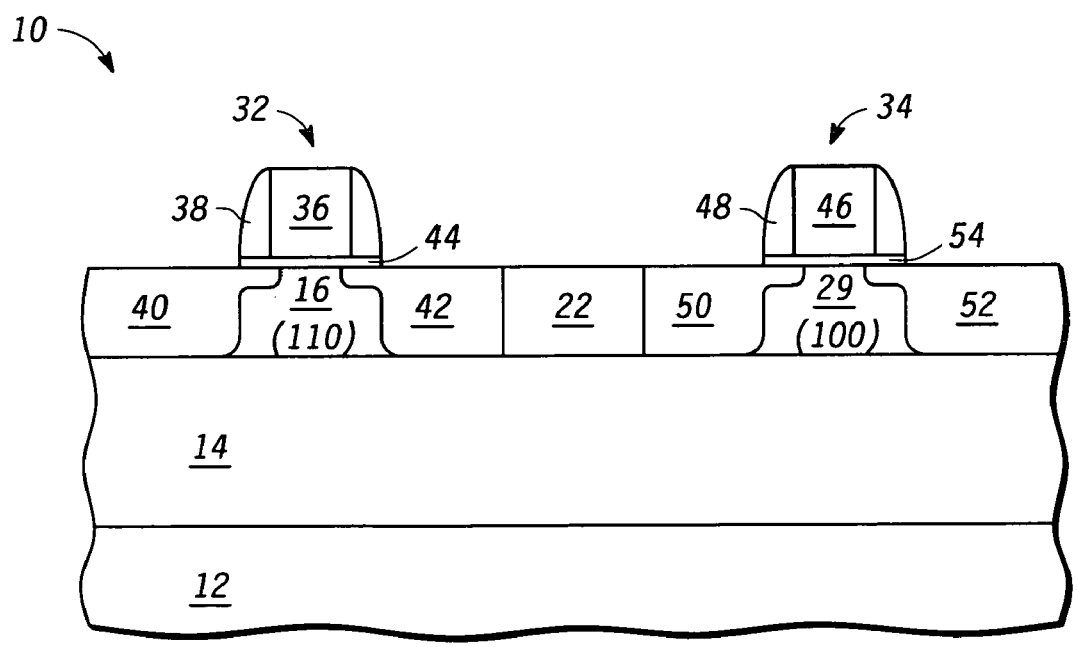
FIG. 10 is a cross section of the semiconductor device structure of FIG. 9 at a subsequent stage in processing to that shown in FIG. 9.

Shown in FIG. 10 is semiconductor device structure 10 after forming a P channel transistor 32 in and over semiconductor region 16 and an N channel transistor 34 in and over semiconductor region 29. Transistor 32 comprises a gate 36 over semiconductor region 16, a sidewall spacer 38 around gate 36, a source/drain 40 in semiconductor region 16 on one side of gate 36, a source/drain 42 in semiconductor region on the other side of gate 36, and a gate dielectric 44 between gate 36 and semiconductor region 16. The portion of semiconductor region 16 that is between source/drain regions 40 and 42 functions as the channel. Transistor 34 comprises a gate 46 over semiconductor region 29, a sidewall spacer 48 around gate 46, a source/drain 50 in semiconductor region 29 on one side of gate 46, a source/drain 52 in semiconductor region on the other side of gate 46, and a gate dielectric 54 between gate 46 and semiconductor region 29. The portion of semiconductor region 29 that is between source/drain regions 50 and 52 functions as the channel.

Thus an N channel transistor is formed in the preferable (100) surface orientation and a P channel transistor is formed in the preferable (110) surface orientation with both being SOI transistors. A benefit of this method is that at the time of conversion from amorphous to monocrystalline, there is only one crystal surface that is in contact with the amorphous region. Thus, the amorphous region does not have competing crystal properties that would tend to result in more than one type of crystal structure being formed. This would result in interfaces between different crystal orientations that would reduce the desired enhancement while creating current leakage issues at the interface. Another benefit is that the donor wafer is completely removed so that there is no residual interface in the finished semiconductor device structure. Further by removing the donor wafer, the process can be repeated for a third semiconductor region in the case where three or more different crystal properties are desired for the different transistors.

Figure 11:
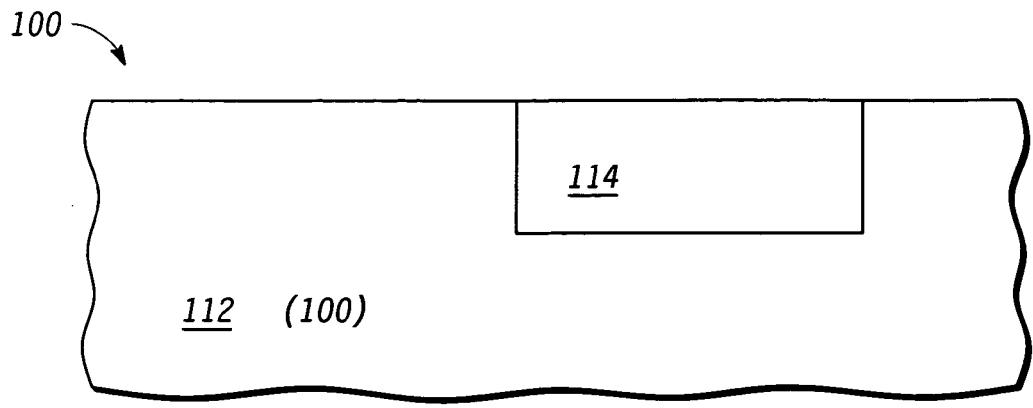

Shown in FIG. 11 is a semiconductor device structure 100 comprising a semiconductor substrate 112 of a (100) surface orientation having an insulating layer 114 formed therein. Insulating layer 114 is for forming an active region therein so is formed as an isolation region. A technique for conventional trench isolation is preferred for this. In this case the insulating layer 114 is preferably about 3500 Angstroms deep. Semiconductor 112 is a conventional semiconductor substrate.

Figure 12:
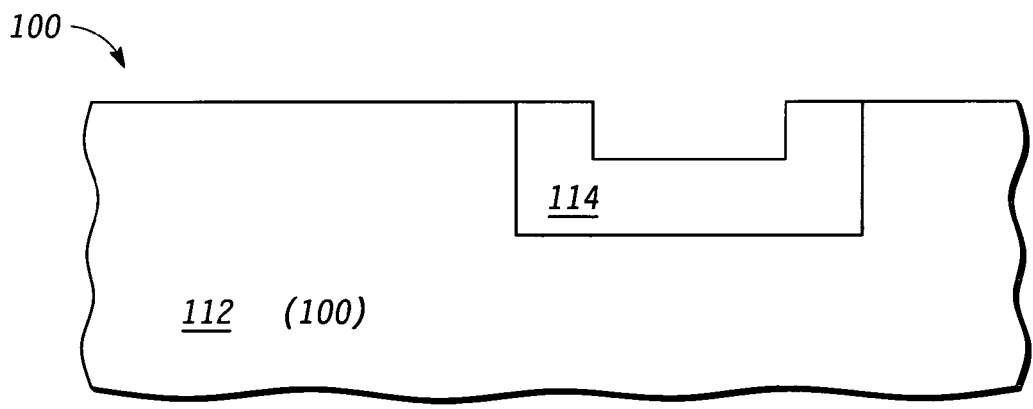

Shown in FIG. 12 is semiconductor device structure 100 after removing a portion of insulating layer 114.

Figure 13:
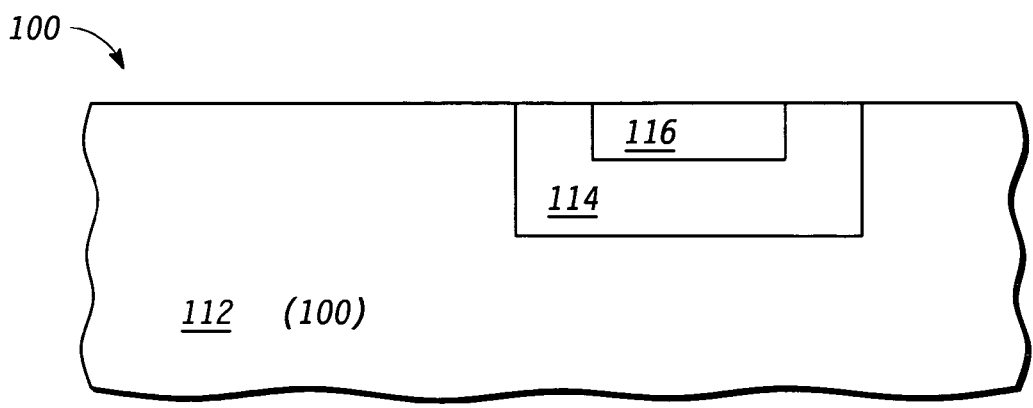

Shown in FIG. 13 is semiconductor device structure 100 after filling the removed portion of insulating layer 114 with an amorphous region 116. The dimensions of amorphous region 116 are the same as for a desired active region for a transistor. The dimensions will vary based on the desired channel width and length of the transistor to be formed and the contacts to the source/drains. The depth would normally be expected to be the same for all of the transistors but could vary.

Figure 14:
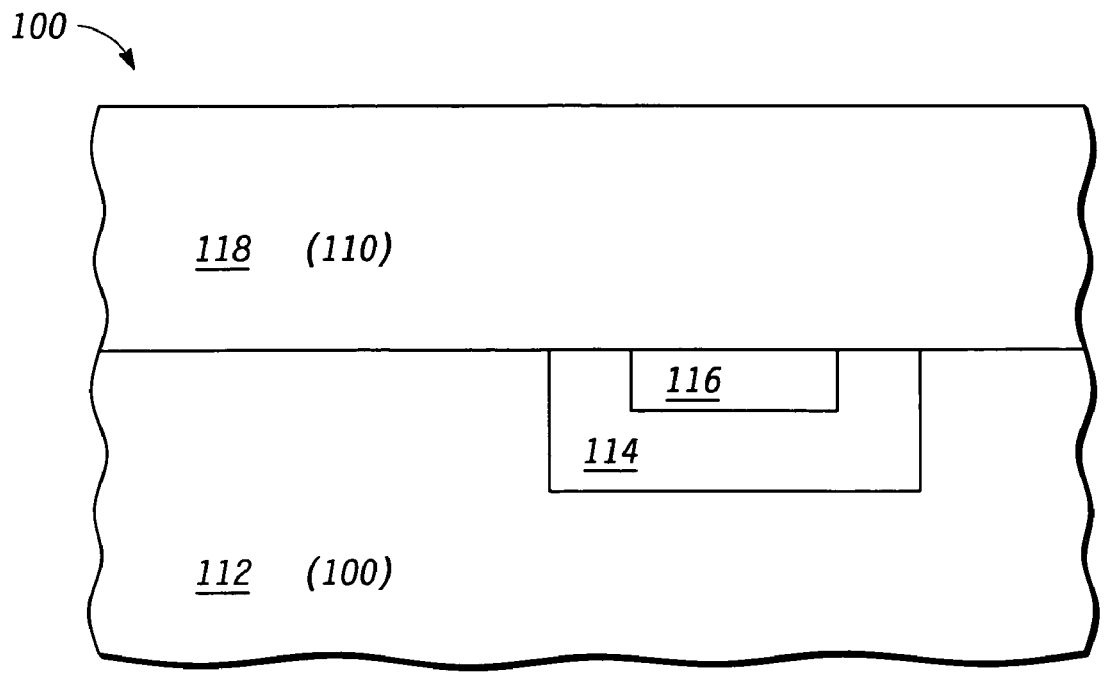

Shown in FIG. 14 is semiconductor device structure 100 after applying a semiconductor substrate 118 having, in this example, a surface orientation of (110).

Figure 15:
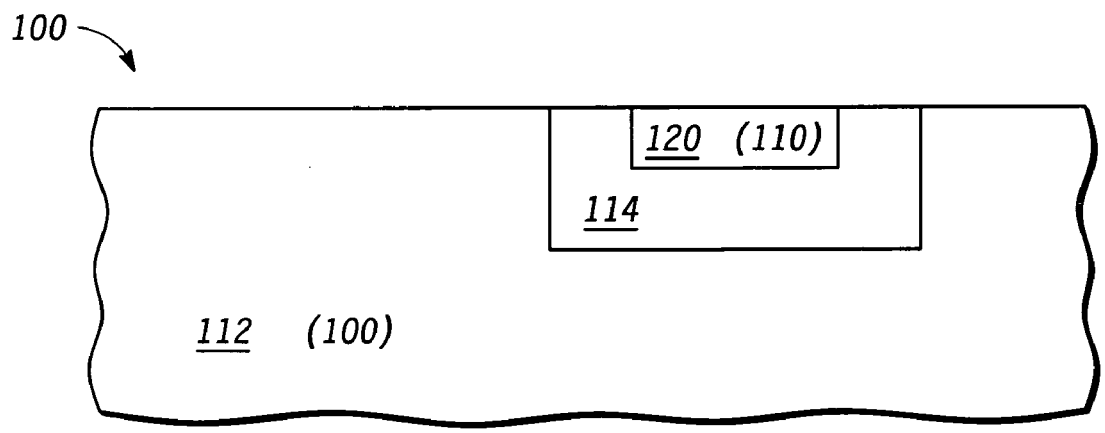

Shown in FIG. 15 is semiconductor device structure 100 after heat has been applied as described in FIG. 8 so as to transfer the crystal properties of semiconductor substrate 118 to amorphous region 116 to convert it to a semiconductor region 120 having the (110) surface orientation. FIG. 15 also shows that semiconductor substrate 118, the donor wafer, has been removed. The removal of semiconductor substrate 118 can be achieved in the same manner as described for the embodiment of FIGS. 1-10. As described previously, if the removal is done in the two steps of cleaving and CMP, the cleaving can occur before or after the transfer of the crystal properties to the amorphous layer. In particular though, if strain is being transferred, it is likely to be preferable to cleave after the transfer.

Semiconductor device structure 100 is then used to make a P channel transistor in and over semiconductor region 116 and an N channel transistor in and over semiconductor substrate 112. This is substantially the same as shown in 10 with the P channel in the (110) and the N channel in the (100). In this example, the starting material is (100) and is a bulk substrate instead on an SOI wafer. The result in this case is that the P channel transistor is an SOI transistor and the N channel transistor is a bulk transistor. The process of FIGS. 12-15 can be repeated to form other semiconductor regions of different crystal properties. In fact the whole top portion of semiconductor substrate 112 can be an insulating layer like insulating layer 114 so that all of the transistors are formed in semiconductor regions formed in the same manner as semiconductor region 120. For each crystal type, the process begins with removing a portion of the insulating layer, followed by filling it with an amorphous semiconductor. The existing semiconductor regions would retain there crystal properties that have already been transferred. The process would continue with the transfer from a donor wafer. After all the semiconductor regions have been converted to their particular desired crystalline structure, the transistors are formed.

The embodiment of FIGS. 11-15 can also be varied in other ways as well. For example, after transistor formation on semiconductor substrate 112 or even as formed in FIGS. 1-10, an insulating layer analogous to insulating layer 114 could be formed over semiconductor device structures 10 and/or 100. After formation of this overlying insulating layers, transistors can be formed in that insulating in the manner described for forming transistors in insulating layer 114.

In the case of P channel transistors, narrow channel width devices operate best under different crystal properties than do wide channel width transistors. Thus, for the P channel transistors, it may be desirable to have two different crystal properties in which both are different than for the N channel. This may include crystal rotation in the case where it is desirable to have the transistors aligned in the same direction but have different crystal rotation. This may come up in laying out an array for example. Further, it may in fact be desirable to have weak P channel devices, as in the case of SRAM load devices, in which the P channel crystal properties would desirably be different for the array than for the logic. In order to achieve the third semiconductor region with a third crystal property, steps similar to FIGS. 4-9 or FIGS. 12-15 would be repeated. The cross section of FIG. 4 shows a raised isolation region 22 and the presence of an oxide layer 18 that would not be present. The step analogous to FIG. 4 would simply have the patterned photoresist over the structure shown in FIG. 4 to expose a third region that is to receive the amorphizing implant. The steps shown in FIGS. 5-9 are then repeated.

The example of transferring surface orientation has been described, but this method is effective for transferring other crystal properties as well. For example, a strain may be transferred to amorphous regions 116 and 28 either instead of or in addition to the surface orientation. For a P channel transistor, the strain would be compressive to enhance performance. In the case of transferring strain, the step of cleaving the donor wafer as shown in FIG. 7 would preferably occur after the transfer of the crystal property shown in FIG. 8. The larger donor wafer would be better at retaining the strain to be transferred than would the less thick donor wafer that is present after cleaving. Further in the case of transferring strain in particular, the donor wafer can be a different composition from the amorphous region. For example, a relaxed silicon donor wafer can transfer strain to an amorphous silicon germanium region. The reverse is also true Various other changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

The invention claimed is:

1. A method of forming a semiconductor device comprising:
   providing an insulating layer;
   forming a first layer on the insulating layer, the first layer having a first property;
   separating the first layer into first and second separate areas which have no surfaces in contact with each other and electrically isolating the first and second separate areas;
   after separating the first layer, amorphizing only the first of the first and second separate areas;
   applying a donor wafer overlying and in contact with the first and second areas;
   annealing the semiconductor device to modify the first of the first and second separate areas to have a different property from the second of the first and second separate areas;
   removing the donor wafer; and
   forming at least one semiconductor structure in each of the first and the second of the first and second separate areas.

2. The method of claim 1 further comprising:
   providing the donor wafer as a wafer having at least one of differing strain, differing composition, differing surface orientation or differing crystal rotation from the second portion of the first layer.

3. The method of claim 1 wherein the second separate area of the first layer has a first surface orientation, and the donor wafer and the first separate area of the first layer has a second surface orientation differing from the first surface orientation.

4. The method of claim 1 further comprising:
   providing a substrate underlying the insulating layer, wherein the second separate area of the first layer has a surface orientation of either (110) or (100), and the donor layer has a surface orientation of (100) or (110) depending upon the surface orientation of second separate area of the first layer.

5. The method of claim 1 wherein the first separate area of the first layer has a crystal rotation of (110) or (100) and the second separate area of the first layer has a crystal rotation having whichever value of (110) or (100) the first separate area of the first layer does not have.

6. The method of claim 1 wherein removing the donor wafer further comprises:
   cleaving a first portion of the donor wafer along a lateral boundary comprising atoms of a predetermined composition; and
   removing a remaining second portion of the donor wafer from the semiconductor device.

7. The method of claim 1 wherein the removing is performed before said annealing of the semiconductor device to modify the first of the first and second separate areas.

8. The method of claim 1 further comprising electrically isolating the first and second separate areas with an oxide material and forming the donor wafer by bonding the donor wafer to the first and second separate areas and the oxide material, the donor wafer comprising a lateral region having atomic irregularities which permit ready cleaving of the donor wafer along the lateral region.

9. A method of forming a semiconductor device comprising:
   providing an insulating layer;
   forming a first layer on the insulating layer, the first layer having a first crystal orientation;
   separating the first layer into physically separate first and second separate areas and electrically isolating the first and second separate areas with a dielectric region;
   after separating the first layer, amorphizing only the first of the first and second separate areas;
   bonding a substrate layer of material to be in contact with the first and second areas and the dielectric region, the substrate layer of material having a second crystal orientation that differs from the first crystal orientation;
   annealing the semiconductor device to modify the first of the first and second separate areas to have the second crystal orientation of the substrate layer of material;
   removing the substrate layer of material; and
   forming at least one semiconductor structure in each of the first and the second of the first and second separate areas.

10. The method of claim 9 wherein removing the substrate layer of material further comprises:
    removing a portion of the substrate layer of material prior to said annealing and removing a remainder of the substrate of material after said annealing.

11. The method of claim 9 wherein removing the substrate layer of material further comprises:
    removing a first portion of the substrate layer of material by cleaving the substrate layer of material along a lateral edge defined by a presence of differing atomic structure; and
    removing a second portion of the substrate layer of material by chemical mechanical polishing the second portion.

12. A method of forming a semiconductor device comprising:
    providing a bulk substrate having a first property;
    forming an isolation region within the bulk substrate;
    forming at least one region of amorphous semiconductor material within the isolation region;
    applying a donor wafer overlying and in contact with an exposed surface of the bulk substrate, the isolation region and the at least one region of amorphous semiconductor material within the isolation region, the donor wafer having a second property which differs from the first property;
    annealing the semiconductor device to transfer the second property of the donor wafer to the at least one region of amorphous semiconductor material within the isolation region;
    removing the donor wafer; and
    forming at least one semiconductor structure in the at least one region of amorphous semiconductor material within the isolation region.

13. The method of claim 12 wherein the first property and second property both comprise at least one of strain, composition, surface orientation or crystal rotation.

* * * * *